(12) United States Patent
Clemens et al.

(10) Patent No.: US 6,178,628 B1
(45) Date of Patent: Jan. 30, 2001

(54) APPARATUS AND METHOD FOR DIRECT ATTACHMENT OF HEAT SINK TO SURFACE MOUNT

(75) Inventors: Donald L. Clemens, The Colony; Mark Mellinger, Flower Mound; Gary Kuzmin, Plano, all of TX (US)

(73) Assignee: Aavid Thermalloy, LLC, Concord, NH (US)

( * ) Notice: Under 35 U.S.C. 154(b), the term of this patent shall be extended for 0 days.

(21) Appl. No.: 09/151,927

(22) Filed: Sep. 11, 1998

Related U.S. Application Data (63) Continuation-in-part of application No. 08/955,481, filed on Oct. 22, 1997.

(51) Int. Cl.[7] ........................................... H05K 3/34
(52) U.S. Cl. .......................... 29/840; 29/832; 228/56.3; 228/124.6
(58) Field of Search .......................... 29/840, 841, 830, 29/832, 829; 228/124.6, 56.3

(56) References Cited

U.S. PATENT DOCUMENTS

| | | | |
|---|---|---|---|
| 5,672,548 | * | 9/1997 | Culmane et al. . |
| 5,675,183 | * | 10/1997 | Swanmy et al. . |
| 5,881,944 | * | 3/1999 | Edwards et al. . |
| 5,917,700 | * | 6/1999 | Clemens et al. . |
| 5,930,114 | * | 7/1999 | Kuzmin et al. . |

* cited by examiner

Primary Examiner—Carl J. Arbes
(74) Attorney, Agent, or Firm—Cohen, Pontani, Lieberman & Pavane (57) ABSTRACT

An apparatus and method for thermally coupling a heat sink directly to a surface mount heat generating device package in a manner which provides a more efficient thermal path between the heat sink and the device package, and which allows for a simplified assembly process. The heat sink is mounted in direct thermal communication with the heat generating device package which is surface mounted to a printed circuit board or other substrate. The inventive heat sink has a reservoir of thermal preform which allows the heat sink to be secured to a device package at the same time as the device package is being secured to the surface mount substrate, as opposed to doing so in a separate step in the assembly process after the electronic device packages have already been secured to the surface mount substrate. The inventive heat sink thereby simplifies the assembly process by eliminating steps in the manufacturing process and by allowing for the further automation of the assembly process.

10 Claims, 7 Drawing Sheets

APPARATUS AND METHOD FOR DIRECT ATTACHMENT OF HEAT SINK TO SURFACE MOUNT

This patent application is a continuation-in-part of application Ser. No. 08/955,481 filed on Oct. 22, 1997. This application hereby incorporates by reference the content of application Ser. No. 08/955,481, in its entirety.

FIELD OF THE INVENTION

The present invention relates to an apparatus and method for thermally coupling a heat sink directly to a surface mount heat generating device package in a manner which provides a more efficient thermal path between the heat sink and the device package, and which allows for a simplified assembly process. More particularly, it relates to a heat sink having a reservoir of thermal binder which allows the heat sink to be secured to a device package prior to or at the same time the device package is secured to the surface mount substrate, thereby simplifying the assembly process while providing a very efficient thermal interface between the heat sink and the heat generating device package.

BACKGROUND OF THE INVENTION

Many electronic devices and electrical systems, such as transistors, integrated circuits, power controls, switches, microprocessors, and the like, generate heat during operation. The capability of some electronic devices is limited by their ability to remove or expel internally generated heat. This heat should be removed from the device to avoid general or localized thermal degradation or failure of the device. In some devices, the heat generated is sufficiently dissipated to the surrounding environment by the enclosure, package, header, or leads. Other devices require additional heat dissipating apparatus, such as heat sinks, heat exchangers, etc., for removing and dissipating excess thermal energy. For purposes of the present invention, a heat sink is any body of thermally conductive material such as metal or other like material which is placed in thermal communication with an electronic device package or other heat generating component for transferring internally generated heat from the device and rapidly dissipating this heat to the surrounding environment by conduction, convection, and/or radiation. Heat sinks may be extruded, machined, molded, sawed, or formed of sheet metal bodies.

It is instructive to consider the dissipation of heat from a heat generating device in terms of heat transfer, that is, the movement or transfer of heat from the device to the heat dissipating apparatus where the heat may be efficiently dissipated. The term "thermal path" will be used herein to refer to the path along which the heat is transferred from the heat generating device through the heat dissipating device (generally a heat sink) to the surrounding environment. A typical thermal path for a heat dissipating assembly would be as follows: the heat is generated by a heat generating electronic device package; the heat travels from the device package through a first thermal interface between the device package and a heat sink; the heat travels through the heat sink; the heat travels through a second thermal interface between the heat sink and the surrounding environment; and the heat is then dissipated into the surrounding environment. In order to ensure that the heat can be dissipated from the heat generating device at a sufficient rate, the heat must be able to travel from the heat generating device to the dissipating environment at a rate commensurate with the rate at which the heat is being generated. Accordingly, the heat must be able to travel along the thermal path as efficiently as possible. Thus, each step in the thermal path from the heat generating device to the dissipating environment must be designed to maximize the efficient transfer of heat. For example, to maximize the rate at which heat can be transferred through the heat sink itself, heat sinks are generally made of materials having high coefficients of thermal conduction such as aluminum, copper, and alloys thereof. Similarly, since a typical heat sink for electrical applications functions by conducting heat away from the heat generating component and dissipating the heat into the surrounding air, heat sinks are typically shaped to maximize surface area by incorporating fins or pins. Increasing the heat sink's surface area increases the physical size of the thermal interface between the heat sink and the surrounding atmosphere (the second thermal interface referenced above), thereby increasing the heat sink's ability to dissipate heat to the surrounding atmosphere.

Of particular interest to the invention at hand, is the first thermal interface, i.e., the thermal interface between the heat sink and the heat generating device package. In order for the heat generated to efficiently travel from the heat generating device to the heat sink, the heat sink must be placed in efficient thermal communication with the heat generating device package. Generally, the most efficient thermal communication can be achieved by securing the heat sink directly to the heat generating device package. Various means have been used to attach heat sinks in efficient thermal communication with heat generating device packages. A known practice is to glue, solder, or otherwise adhere a heat sink directly to a heat dissipating surface of the body of a heat generating device package with heat-conductive epoxy, solder paste, thermally enhanced adhesives, or the like. Heat sinks may also be mechanically attached to heat generating device packages with resilient metal clips mounted on the heat sink or with screws, bolts, clamps, or other connective means which urge the heat sink and electronic device package into mutual physical contact. Although typically not as efficient, heat sinks may also be remotely located but thermally coupled to a heat generating device via a heat spreader device, a heat pipe, or any other means of transferring heat from the source of the heat to the heat sink.

Recently, technological advances have allowed electronic components to decrease in size while significantly increasing in power and speed. This miniaturization of electronic components with increased capability has resulted in the generation of more heat in less space. As a result, the electronic device packages have less physical structure for dissipating heat and less surface area for attaching a heat sink to dissipate the heat. The reduction of surface area available to attach a heat sink or other heat dissipating device reduces the effective thermal path for the heat to move from the heat generating device to the heat dissipating device. A smaller thermal path means less heat can move from the heat generating device to the heat sink; thus, the heat is dissipated at a slower rate and ultimately less heat can be dissipated.

Further complicating these general thermal management issues is the growing preference for surface mounting electronic components on printed circuit boards (PCBs) or other substrates. The use of surface mount PCBs or substrates has become increasingly popular because such substrates allow for a less costly and less time consuming process of fabricating and populating the PCB. As opposed to the manufacturing assembly process of older substrates which required insertion of components through holes in the circuit board for subsequent soldering operations, surface mount PCBs allow for the increased use of automated manufacturing and assembly techniques. In particular, surface mountable devices are typically robotically picked and placed on the PCB and then soldered to the PCB in one automated manufacturing process. In addition to reducing assembly costs, however, the surface mount technology has also allowed for even greater miniaturization of the electronic device packages used on the boards. These smaller surface mount device packages further reduce the device's ability to dissipate its own heat, thus increasing the need for separate heat sinks. In addition, the smaller packages make it increasingly difficult to attach a heat sink directly to the device package. Finally, even when a heat sink can be attached directly to the heat generating device package, the efficiency of the thermal path is limited by the available contacting surface area on the smaller device package.

Several methods have been suggested to effectively dissipate heat from these smaller surface mount electronic device packages. One common approach is to use the ground plane, or other similar thermally conductive area of the PCB (such as a thermal plane, thermal pad, or thermal land) as a rudimentary heat sink to spread and dissipate the heat directly from the PCB. If the ground plane is used as a thermal plane, heat from the electronic device package can be transferred to the thermal/ground plane via the ground leads of the electronic device package. Additionally, if the electronic device package has a collector tab, or other heat dissipating tab, this tab can be thermally coupled to the thermal plane of the PCB via a thermal pad on the surface of the PCB. Thus, the ground leads or tab of the electronic device package can be used as "thermal leads" to transfer heat from the device package to the thermal plane of the PCB. It should be noted, however, that the heat transferred to the thermal plane of the PCB must eventually be dissipated to the surrounding environment. If the thermal plane and thermal pads are incapable of adequately dissipating the heat to the surrounding atmosphere, a heat sink or other heat dissipating device may still be required. If required, a heat sink can be soldered to a thermal pad in direct, or indirect, thermal communication with the thermal plane. Although the thermal pads and heat sinks may ultimately provide adequate dissipation of the heat generated, these alternatives often consume valuable board space thereby increasing the size of the PCB or limiting the available board space for populating the PCB, both of which are undesirable side effects.

As noted, surface mount substrates or PCBs are desirable because of the efficient manufacturing process which can be used to assemble and populate such substrates with surface mount device packages. In a simplified form, the typical surface mount manufacturing process involves the following steps or operations. First, a solder paste is applied to the substrate or PCB using a mask to ensure that the paste is only applied to certain predetermined locations on the substrate and in certain predetermined amounts at those locations. After the solder paste has been applied, each electronic device package is placed on the substrate at a predetermined location in the solder paste. The location of the device package is critical because the device package is located such that its electrical leads will contact the exposed pads or leads on the substrate. Given the relatively small size of the leads on today's electronic device packages, even a small error in locating a device package could easily result in an electrical short or other misconnection. Although the solder paste is "tacky" (i.e., it has some limited adhesive quality) and will hold the device packages to some extent, the device packages are not secured to the substrate at this stage of the assembly process. Since the device packages are not yet secure, care must be taken not to dislodge or move the device packages while placing other device packages on the substrate or otherwise handling the substrate. Accordingly, heat sinks which are to be placed in direct physical contact with heat generating device packages typically can not be placed on the substrate at this stage of the process. Instead, these heat sinks typically must be placed on the substrate after the device packages have been secured to the substrate. Since the electronic device packages, however, are generally placed in physical locations on the board remote from one another, the device packages can typically all be placed on the board before any of the devices are secured to the substrate. Once all the device packages have been placed on the substrate, the entire assembly is heated in order to secure all of the device packages at once. This heating operation heats the solder in the solder paste causing the solder to melt and flow. After a predetermined time for the heating operation, the assembly is then allowed to cool and the solder reforms or hardens thereby securing the electronic device packages to the substrate. Once the device packages are secured to the substrate, other devices such as heat sinks can be placed on the PCB without any danger of dislocating the device packages from their correct, and now set, positions. These devices can then be secured by additional heating operations.

It is an object of the present invention to provide a method and apparatus which will allow a heat sink, which will ultimately be in direct thermal contact with a surface mount heat generating electronic device package, to be placed on the substrate in the surface mount assembly process before the device packages are secured to the substrate. Such an inventive method and apparatus will thereby allow for the device packages and any required heat sinks to be placed and secured to the surface mount PCB in a unified operation instead of in numerous distinct sub-operations.

SUMMARY OF THE INVENTION

In accordance with the present invention, there is provided a novel method and apparatus for dissipating heat from a surface mount heat generating electronic device package using a heat sink adapted to simplify the typical surface mount manufacturing assembly process while providing enhanced thermal communication directly to the heat generating device package. More particularly, the novel heat sink can be placed on the substrate in the typical surface mount assembly process before the device packages are secured to the substrate since the heat sink is not initially in direct contact with the device package. The novel heat sink supports a reservoir of thermal binder which will melt and flow in the typical heating process used to secure the surface mount device packages to the substrate. During the heating process, the thermal binder flows along the heat sink between a contacting surface of the heat sink and a heat dissipating surface of the heat generating device package. When cooled, the thermal binder forms an efficient thermal interface between the heat sink and device package. Such an inventive heat sink not only provides for an extremely efficient thermal interface between the heat sink and heat generating device package, but it also allows for the device packages and the heat sinks to be placed and secured to a surface mount PCB in a unified operation instead of in numerous distinct sub-operations.

The inventive heat sink typically comprises a body of thermally conductive material having a contacting surface; a feature on the body adjacent the contacting surface; and a reservoir of thermal binder supported by the feature of the body, which when heated to a predetermined temperature will flow along the body to the contacting surface.

In an alternate embodiment, the heat sink comprises a body of thermally conductive material having a thermal leg; a feature on the thermal leg; and a reservoir of thermal binder supported by the feature on the thermal leg, which when heated to a predetermined temperature will flow along the thermal leg.

The assembly incorporating the inventive heat sink typically comprises a heat generating electronic device package having a heat dissipating surface; and a heat sink comprising a body of thermally conductive material having a contacting surface; a reservoir of thermal binder supported by the body of the heat sink adjacent the contacting surface such that when heated the thermal binder will flow along the body of the heat sink to create a thermal interface between the dissipating surface of the heat generating device package and the contacting surface of the heat sink.

In an alternate embodiment, the assembly comprises a heat generating electronic device package having a thermal lead; and a heat sink comprising a body of thermally conductive material having a thermal leg; a reservoir of thermal binder supported by the thermal leg of the heat sink such that when heated the thermal binder will flow along the thermal leg of the heat sink to create a thermal interface between the thermal lead of the heat generating device package and the thermal leg of the heat sink.

In another alternate embodiment, the assembly comprises a substrate; a heat generating electronic device package having a thermal lead, surface mounted to the substrate; and a heat sink comprising a body of thermally conductive material having a thermal leg, surface mounted to the substrate adjacent the heat generating device package; a reservoir of thermal binder supported by the thermal leg of the heat sink such that when heated to a predetermined temperature the thermal binder will flow along the thermal leg of the heat sink to create a thermal interface between the thermal lead of the heat generating device package and the thermal leg of the heat sink.

The method for assembling a surface mount printed circuit board incorporating the inventive heat sink typically comprises the steps of: (a) providing a surface mount substrate, a surface mount heat generating electronic device package, and a heat sink having a reservoir of thermal binder; (b) applying solder paste onto the substrate in predetermined locations; (c) placing the device package in the solder paste on the substrate in a predetermined location; (d) placing the heat sink on the substrate adjacent the device package; (e) heating the substrate, device package, and heat sink for a predetermined time until the solder paste and the thermal binder on the heat sink flows; and (f) cooling the substrate, device package, and heat sink until the thermal binder hardens to thermally couple the device package and the heat sink, and until the solder in the solder paste hardens to couple the device package to the substrate.

In an alternate embodiment, the method incorporating the inventive heat sink comprises the steps of: (a) providing a surface mount substrate having a thermal pad, a surface mount heat generating electronic device package having a thermal lead, and a heat sink having a thermal leg and a reservoir of thermal binder supported by the thermal leg; (b) applying solder paste onto the substrate in predetermined locations, including the thermal pad; (c) placing the device package in the solder paste on the substrate in thermal communication with the thermal pad; (d) placing the heat sink on the substrate adjacent the device package; (e) heating the substrate, device package, and heat sink for a predetermined time until the solder in the solder paste flows, and until the thermal binder on the heat sink flows along the thermal leg of the heat sink; and (f) cooling the substrate, device package, and heat sink until the thermal binder and the solder in the solder paste harden to thermally couple the thermal lead of the device package to the thermal leg of the heat sink, in thermal communication with the thermal pad on the substrate.

In another alternate embodiment, the method incorporating the inventive heat sink comprises the steps of: (a) providing a surface mount heat generating electronic device package and a heat sink having a reservoir of thermal binder; (b) placing the heat sink adjacent the device package; (c) heating the device package and the heat sink for a predetermined time until the thermal binder on the heat sink flows; and (d) cooling the device package and the heat sink until the thermal binder hardens to thermally and physically couple the heat sink and the device package.

Various embodiments of the present invention are more completely described below in reference to the drawings.

BRIEF DESCRIPTION OF THE DRAWINGS

The invention can be more fully understood by referencing the accompanying drawings wherein.

DETAILED DESCRIPTION OF THE DRAWINGS

Figure 1:
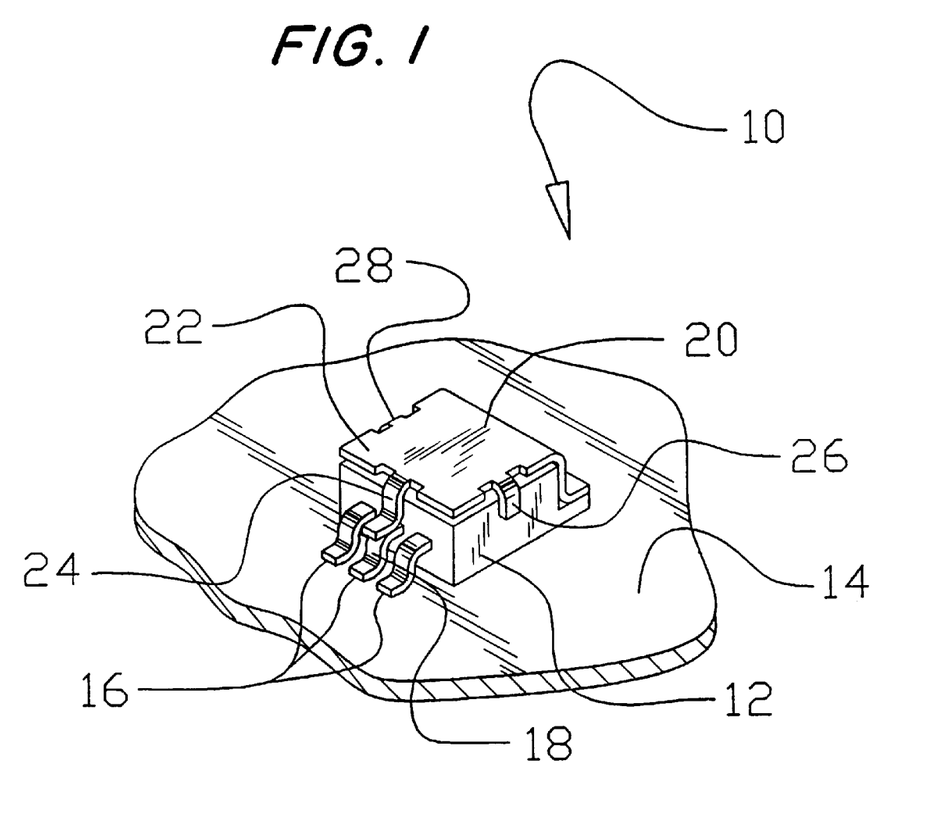
FIG. 1 is a perspective view of a heat dissipating assembly incorporating an embodiment of the heat sink of the present invention, where the thermal lead of the electronic device package is a ground lead of the device.

Referring now to the drawings, wherein like reference characters denote corresponding parts:

A heat sink assembly in accordance with the present invention is illustrated in FIG. 1. As shown in FIG. 1, the heat dissipating assembly 10 incorporating an embodiment of the inventive heat sink 20 comprises a heat generating electronic device package 12 surface mounted to a substrate 14 with an embedded thermal plane (not visible). The substrate 14 is typically a PCB or some similar generally planar surface used for surface mounting electronic devices. The substrate 14 does not necessarily have to include a thermal plane, however, as previously discussed, the ground plane of the substrate or PCB is typically used as a thermal plane to transfer heat.

The heat generating electronic device package 12 shown in FIG. 1 has three electrical leads 16, although the invention contemplates electronic device packages having more or less leads than shown. For the device package 12 shown, the middle electrical lead is a ground lead and is electrically and thermally connected to the thermal/ground plane of substrate 14. Accordingly, this middle lead is the thermal lead 18 of the electronic device package 12.

FIG. 1 shows an embodiment of the inventive heat sink 20 mounted directly to, i.e. piggyback on, the electronic device package 12. The heat sink 20 is made of highly thermally conductive material such as copper or aluminum. The body 22 of the heat sink 20 is shown as a generally planar surface supported above the electronic device package 12; however, the body 22 may be any structurally stable configuration. The body 22 of the heat sink 20 is approximately the same dimension as the electronic device package 12. Since the body 22 of the heat sink 20 does not extend significantly beyond the outer dimensions of the electronic device package 12, the heat sink 20 does not consume additional PCB space. In addition, the body 22 of the heat sink 20 can be mounted flush with the electronic device package 12 such that the bottom surface of the body 22 of the heat sink 20 is in physical contact with the top surface of the electronic device package 12. By increasing the contact surface area between the heat sink 20 and the heat generating device package 12, the physical dimension and capacity of the thermal interface between the heat sink 20 and device package 12 is increased. Similarly, by increasing the surface area of the body 22 of the heat sink 20, by the use of pins, fins, or otherwise, the capacity of the heat sink 20 to dissipate heat to the surrounding environment can be increased.

Thermal leg 24 can be used to further enhance the heat sink's 20 ability to dissipate heat from the heat generating device package 12. The thermal leg 24 extends from the body 22 of the heat sink 20 to the thermal lead 18 of the electronic device package 12 such that the thermal leg 24 is in mutual physical contact with the thermal lead 18. The thermal leg 24 is preferably thermally coupled to the thermal lead 18 using a thermal binder such as heat-conductive epoxy, other thermally enhanced adhesive, solder, etc. To increase the contact surface area between the thermal leg 24 and the thermal lead 18, the thermal leg 24 can be formed arcuate, angled, or can be otherwise shaped such that a portion of the thermal leg 24 is generally adjacent and parallel to a contacting surface of the thermal lead 18. To further increase the contact surface area between the thermal leg 24 and the thermal lead 18, the thermal leg 24 should have approximately the same width as the thermal lead 18. The size and shape of the thermal leg 24 should be designed to maximize the contact surface area between the thermal leg 24 and the thermal lead 18, while ensuring that the thermal leg 24 does not contact the other electrical leads 16 causing an electrical short to ground. It should also be noted, however, if adjacent electrical leads 16 are also ground leads which are used as thermal leads 18, a single thermal leg 24 from the heat sink 20 may be used to contact multiple thermal leads 18 by simply increasing the width of the thermal leg 24 to extend over the adjacent thermal leads 18. Alternatively, multiple thermal legs 24 may be formed in the heat sink 20 to contact multiple thermal leads 18, where the thermal leads 18 are adjacent or separated by other electrical leads. Ultimately, maximizing the contact surface area between the thermal leg 24 and the thermal lead 18 will enhance the thermal interface between the heat sink 20 and the heat generating electronic device package 12, thereby increasing the heat sink's 20 ability to dissipate heat from the heat generating electronic device package 12.

Another feature of the inventive heat sink 20 shown in FIG. 1 is the first alignment leg 26 which extends from the body 22 of the heat sink 20. The first alignment leg 26 is adapted to engage a side of the heat generating electronic device package 12. A second alignment leg 28 extends from the body 22 of the heat sink 20. The second alignment leg 28 is adapted to engage the side of the heat generating electronic device package 12 opposite from the side engaged by the first alignment leg 26. Any number of alignment legs 26,28 can be formed in the heat sink 20 and can be used to engage any part of the electronic device package 12 so long as that part is not carrying an electrical current or signal such that it would be shorted by the alignment leg. The first and second alignment legs 26,28 align the heat sink 20 such that the thermal leg 24 of the heat sink 20 aligns with the thermal lead 18 of the electronic device package 12. These alignment legs 26,28 assist in the assembly of the heat sink 20 to the heat generating electronic device package 12 by properly aligning the heat sink 20. In addition, the alignment legs 26,28 serve to keep the heat sink 20 in place during the manufacturing process, thus allowing for the automated placement of the heat sink 20 on the heat generating electronic device package 12, or for the heat sink 20 and device package 12 to be automatically placed on the substrate as a preassembled unit thereby facilitating a subsequent oven or heating process in which the surface mount device packages 12 and the heat sink 20 can be soldered in place in a unified operation. In addition, the alignment legs 26,28 help ensure that the heat sink 20 will stay in place even after manufacturing, thereby preventing the thermal leg 24 from slipping into contact with other electrical leads 16 causing a short. Alternatively, a portion of the thermal leg 24 can be angled or arcuate such that it engages the side or another portion of the heat generating electronic device package 12 to similarly align the heat sink 20 on the device package 12.

Figure 2:
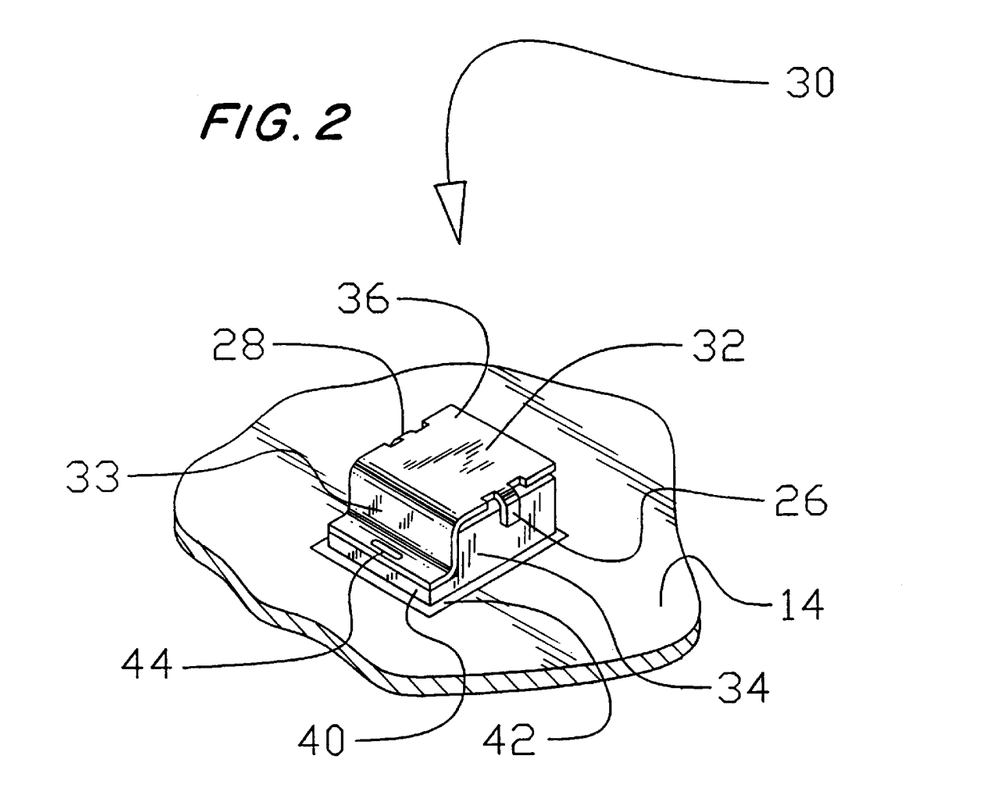
FIG. 2 is a perspective view of a heat dissipating assembly incorporating an embodiment of the heat sink of the present invention, where the thermal lead of the electronic device package is the tab of the device.

FIG. 2 shows a perspective view of the heat dissipating assembly 30 incorporating an alternate embodiment of the inventive heat sink 32. The heat dissipating assembly 30 is similar to the assembly 10 of FIG. 1. The heat dissipating assembly 30 again comprises a heat generating electronic device package 34 surface mounted to a substrate 14. The heat sink 32 is mounted directly on the electronic device package 34. The body 36 of the heat sink 32 is generally planar and the heat sink 32 incorporates two alignment legs 26,28 engaging opposite sides of the electronic device package 34. The thermal leg 38, however, extends from the body 36 of the heat sink 32 to make contact with another type of thermal lead 40. The electronic device package 34 utilizes a tab as a thermal lead 40. Electronic device packages 34 which include a tab-type thermal lead are often referred to as a TO-220 package, or $D^2$ package for surface mount applications. The tab-type thermal lead 40 of electronic device package 34 is thermally connected to the thermal plane of the substrate 14 via a thermal pad 42. The thermal pad 42 is formed on the surface of the substrate 14 and is made of materials having a high coefficient of thermal conductivity such as copper. The thermal lead 40 is typically soldered to the thermal pad 42 to ensure an efficient and sturdy thermal connection.

The thermal leg 38 of the heat sink 32 is adapted to increase the amount of surface area contact between the thermal leg 38 and the thermal lead 40 of the electronic device package 34. The thermal leg 38 is shown angled or arcuate such that a portion of the thermal leg 38 is generally adjacent and parallel with a substantial portion of the thermal lead 40. In addition, the parallel portion of the thermal leg 38 is sized to approximately match the dimensions of the thermal lead 40 thereby increasing the surface area contact between them. By increasing the contact surface area between the thermal leg 38 and the thermal lead 40, a larger and more efficient thermal interface is achieved between the heat generating electronic device package 34 and the heat sink 32 thereby increasing the rate and amount of heat which can be dissipated. In sum, the thermal leg 38 provides an additional thermal connection to the heat generating device package 34 and thereby provides an enhanced thermal path to conduct heat away from the heat generating electronic device package 34 to the heat sink 32 for dissipation.

The efficiency and capacity of the heat dissipating assembly 30 can also be increased by thermally coupling the thermal leg 38 to the thermal lead 40 with a thermal binder such as heat-conductive epoxy, thermal adhesive, solder, etc. Rather than manually applying a thermal binder to the contacting surfaces of the heat sink 32 and device package 34, the use of a thermal binder can be facilitated by using a feature 44 on the body of the heat sink 32 to support or hold the thermal binder for later use during the manufacturing assembly process. If the thermal leg 38 has sufficient surface area, the feature 44 can be an aperture formed in the parallel portion of the thermal leg 38 adjacent the thermal lead 40 as shown in FIG. 2. The aperture feature 44 provides a convenient place to store a reservoir of thermal binder for use during the manufacturing process. The reservoir of thermal binder may comprise a solder supply, such as a solder bead, solder plug, or glob of solder paste, or a supply of thermal epoxy or other heat-conductive thermal adhesive. In general, however, a preform of thermal binder such as a solder preform or other thermally conductive preformed material (collectively referred to herein as a "thermal preform") should be used so the thermal binder is in a sufficiently stable state such that it will remain in the aperture feature 44 until heated to a predetermined temperature.

When the heat dissipating assembly 30 is heated to reflow the solder mask on the surface mount PCB, (in the standard manufacturing assembly process for surface mount PCBs as previously described), the thermal preform supported in the aperture feature 44 will also reflow thereby soldering or otherwise attaching the thermal leg 38 to the thermal lead 40 of the heat generating electronic device package 34. The size of the tab or thermal lead 40 of the heat generating device 34 determines the amount of surface area to be thermally coupled by the thermal binder and thus determines the proper amount of thermal preform to be used in order to adequately secure the thermal leg 38 to the thermal lead 40 without having any runoff of excess thermal binder. Once the thermal binder has cooled and reformed or recast, a very efficient thermal interface between the heat sink 32 and heat generating device package 34 is created. In fact, if solder is used as the thermal binder, the heat sink 32 and heat generating device 34 are essentially unitized with a bimetallic interface created by the solder melting and then reforming between the thermal leg 38 of the heat sink 32 and the thermal lead 40 of the heat generating device package 34.

Not only does use of the thermal binder create an efficient thermal interface between the heat sink 32 and device package 34, but also the thermal binder allows for greater tolerances in manufacturing and assembling the heat sink 32 and device package 34. Specifically, as the thermal preform is heated during the manufacturing process, the thermal binder begins to flow. By placing the solder preform adjacent to the contacting surface 33 of the heat sink 32, in this case that is the bottom surface of the thermal leg 38, gravity will cause the thermal binder to flow along the body of the heat sink 32 to the contacting surface 33. A combination of gravity, surface tension, friction, and other natural phenomena will cause the thermal binder to wick between the contacting surface 33 of the heat sink 32, i.e., the thermal leg 38, and the heat dissipating surface 35 of the heat generating device package 34, i.e., the top surface of the thermal lead 40. This wicking phenomena assures that the thermal binder will fill any gaps between the two surfaces 33, 35. Thus, any variations in the surfaces, such as rough or uneven surfaces caused by manufacturing tolerances or nonparallel surfaces caused by assembly tolerances, are compensated for by the thermal binder, thereby further enhancing the thermal coupling between the surface of the heat sink 32 and the device package 34. Thus, the use of a thermal preform supported by the feature 44, such as an aperture, on the body of the heat sink 32 provides multiple advantages and benefits including the ability to provide thermal binder at the correct location and in the correct amount in order to create a more efficient thermal interface between the heat sink 32 and device package 34.

Figure 3A:
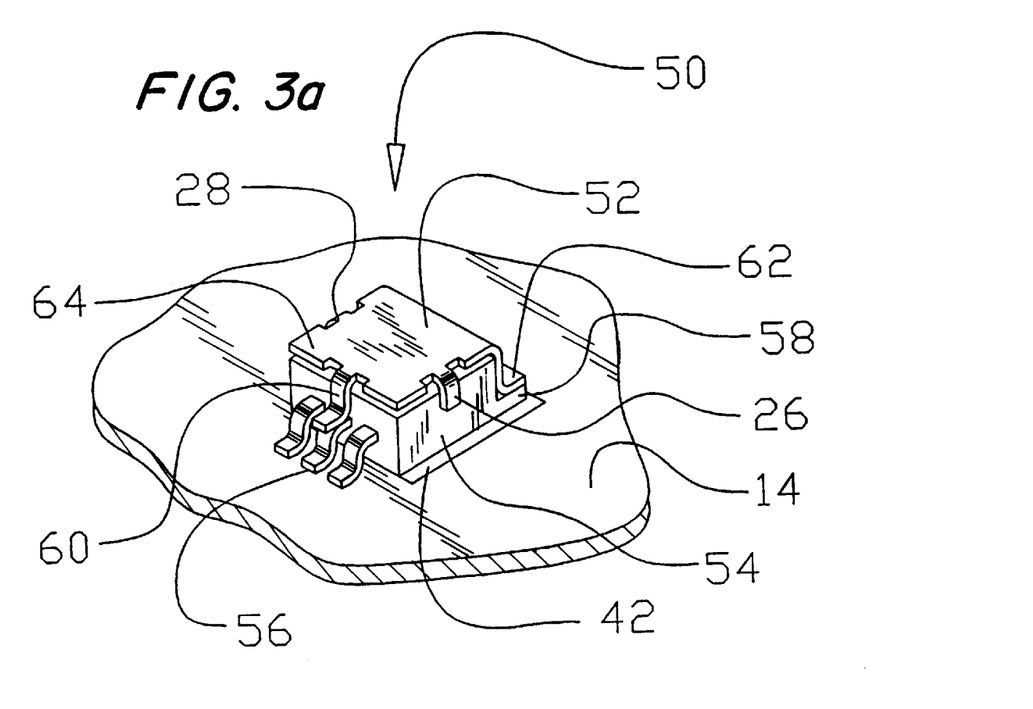
FIG. 3 is a perspective view and a side sectional view of a heat dissipating assembly incorporating an embodiment of the heat sink of the present invention, where the electronic device package has two thermal leads, both a ground lead and a tab of the device.

FIG. 3*a* shows a perspective view of the heat dissipating assembly 50 incorporating an alternate embodiment of the inventive heat sink 52 for use with a heat generating electronic device package 54 having two types of thermal leads 56,58. The first thermal lead 56 is a ground lead of the device package 54 which is thermally coupled to the thermal plane of the substrate 14. The second thermal lead 58 is a collector tab, or other heat dissipating tab, of the electronic device package 54. The tab-type thermal lead 58 is thermally coupled to a thermal pad 42 which is in turn thermally connected to the thermal plane of substrate 14. Corresponding to the two thermal leads 56,58, the heat sink 52 has two thermal legs 60,62. The first thermal leg 60 extends from the body 64 of the heat sink 52 to contact the first thermal lead 56 of the electronic device package 54. Similarly, the second thermal leg 62 extends from the body 64 of the heat sink 52 to contact the second thermal lead 58 of the electronic device package 54. As discussed in reference to FIG. 1 and FIG. 2, the thermal legs 60,62 and thermal leads 56,58 should be shaped and thermally coupled to maximize the surface area of contact, thereby maximizing the thermal path between the heat sink 52 and device package 54, and thus maximizing the capacity and rate of heat dissipation of the assembly 50. Also shown in FIG. 3 are alignment legs 26,28 having the same general form and function as described in reference to FIG. 1 and FIG. 2.

Figure 3B:
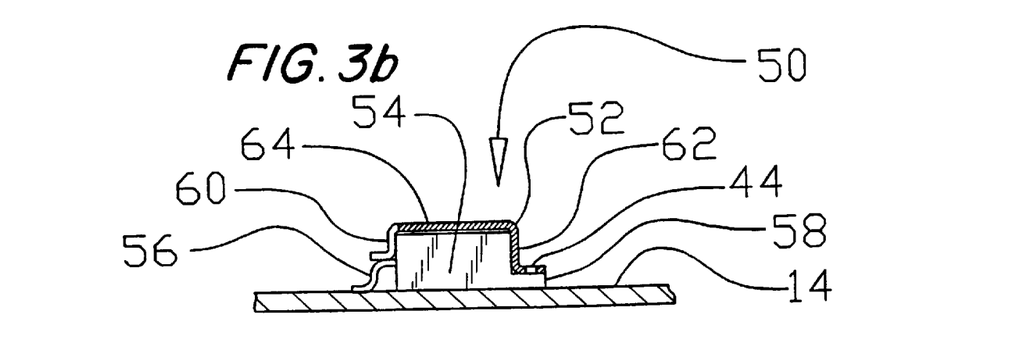

FIG. 3*b* shows a sectional view of the heat dissipating assembly 50 (as shown in FIG. 3*a*) incorporating an alternate embodiment of the inventive heat sink 52 for use with a heat generating electronic device package 54 having two thermal leads 56,58. The heat generating electronic device package 54 is surface mounted to the substrate 14, wherein the device package 54 includes two thermal leads 56,58. The first thermal lead 56 is a ground lead from the device package 54. The second thermal lead 58 is a tab from the device package 54. The heat sink 52 is formed to mount piggyback style on the electronic device package 54. The first thermal leg 60 of the heat sink 52 extends from the body 64 of the heat sink 52 to physically and thermally contact the first thermal lead 56 of the device package 54. Similarly, the second thermal leg 62 extends from the body 64 of the heat sink 52 to contact the second thermal lead 58 of the device package 54. An aperture feature 44 is shown in the second thermal leg 62.

Figure 4:
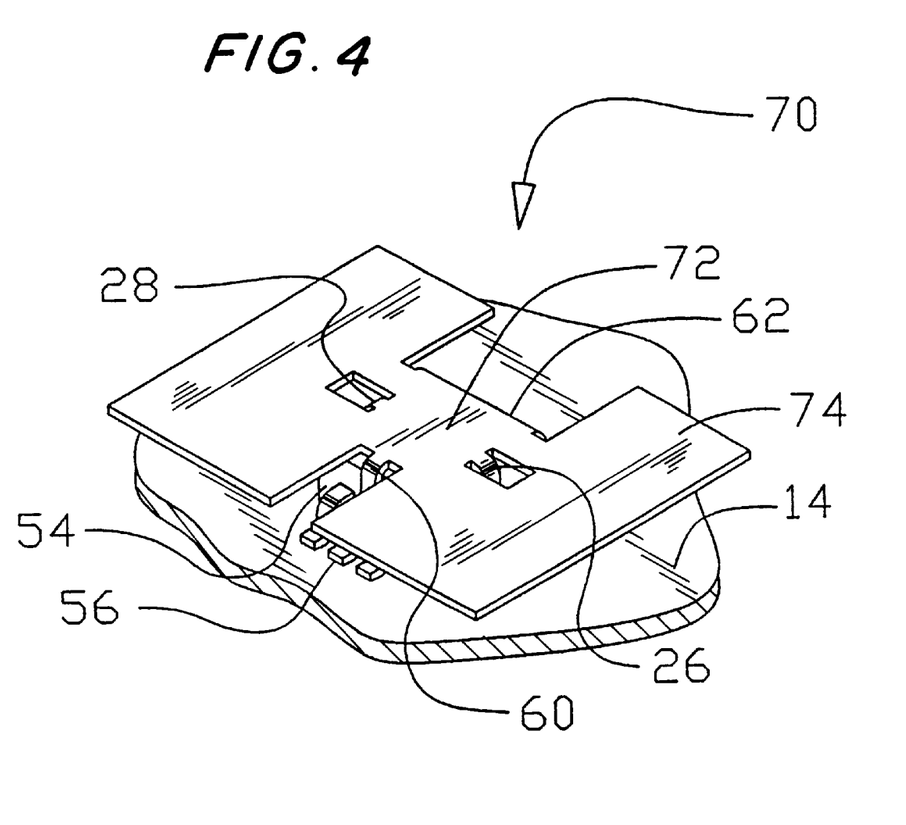
FIG. 4 is a perspective view of a heat dissipating assembly incorporating an embodiment of the heat sink of the present invention, where the surface area of the heat sink has been increased to increase the heat sink's capacity to dissipate heat.

FIG. 4 shows a perspective view of the heat dissipating assembly 70 incorporating an alternate embodiment of the inventive heat sink 72. In particular, a larger heat sink 72 having increased surface area is shown. Increasing the surface area of the heat sink 72 increases the heat sink's ability to dissipate heat to the surrounding environment, thereby increasing the capacity for heat dissipation of the assembly 70. As shown in FIG. 3, the device package 54 includes a first and second thermal lead 56,58 and the heat sink 72 incorporates a first and second thermal leg 60,62 where the thermal leads 56,58 are thermally coupled to the thermal legs 60,62, respectively. A first and second alignment leg 26,28 are shown punched, or otherwise cut, through the larger body 74 of heat sink 72 for aligning the heat sink 72 directly on the electronic device package 54. The device package 54 is again surface mounted to the substrate 14.

Figure 5A:
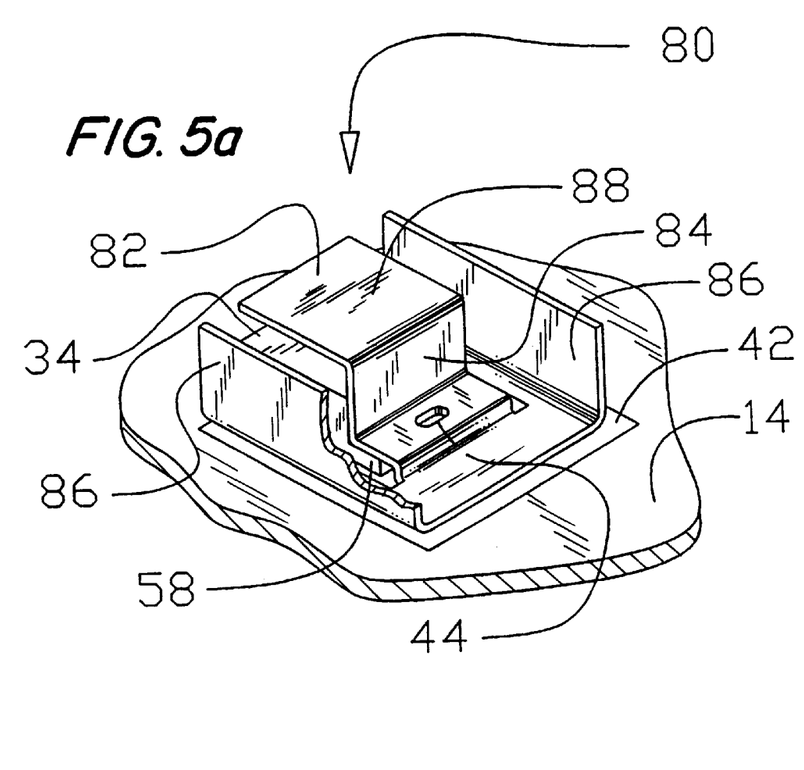
FIG. 5 is a perspective view and a side sectional view of a heat dissipating assembly incorporating another embodiment of the heat sink of the present invention, where the thermal leg of the heat sink is thermally coupled to the thermal lead of the electronic device package and the thermal pad on the surface of the substrate.

FIG. 5a shows a perspective view of the heat dissipating assembly 80 incorporating an alternate embodiment of the inventive heat sink 82. The heat sink 82 is formed to thermally connect directly to the tab-type thermal lead 58 of the electronic device package 34 as well as to the thermal pad 42 on the surface of the substrate 14. In particular, the body 88 of the heat sink 82 comprises a thermal leg 84 extending therefrom. The thermal leg 84 of the heat sink 82 extends to and beyond the thermal lead 58 such that it contacts the thermal pad 42. Wings 86 extend from the thermal leg 84 of the heat sink 82 to further contact the portion of the thermal pad 42 exposed around the outside edges of the electronic device package 34. Increasing the surface area of contact between the thermal pad 42 and the heat sink 82 further increases the thermal path to transfer heat to the heat sink 82. The surface area of the heat sink 82 can be increased to accommodate the increased heat by incorporating fins, pins, etc. In fact, the wings 86 as shown in FIG. 5 extend generally upward from the thermal pad 42 on the surface of the substrate 14, thereby providing increased surface area to dissipate heat from the heat sink 82.

Figure 5B:
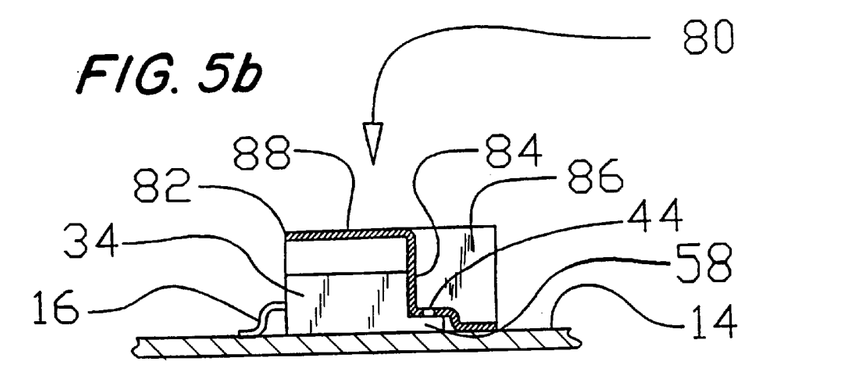

FIG. 5b shows a sectional view of the heat dissipating assembly 80. The heat generating electronic device package 34 is surface mounted to the substrate 14. The electrical leads 16 of the electronic device package 34 are not used as thermal leads. The electronic device package 34, however, does utilize a tab-type thermal lead 58. The heat sink 82 comprises a body 88 and a thermal leg 84 extending from the body 88. The body 88 of the heat sink 82 is generally planar and is supported above the top surface of the electronic device package 34. The thermal leg 84 of the heat sink 82 extends generally downward from the body 88 of the heat sink 82 to the thermal lead 58 of the electronic device package 34 and to the thermal pad 42 on the surface of the substrate 14. The thermal leg 84 is formed arcuate or angled such that a portion thereof is adjacent and parallel with a substantial portion of the thermal lead 58 of the electronic device package 34. The thermal leg 84 is additionally formed angled or arcuate such that another portion of the thermal leg 84 is adjacent and parallel with a substantial portion of thermal pad 42 on the substrate 14. By soldering the heat sink 82 to the thermal lead 58 and the thermal pad 42, an efficient and sturdy thermal connection is achieved. By forming the heat sink 82 to thermally couple to a substantial portion of the thermal lead 58 and the thermal pad 42, a larger thermal path to transfer heat to the heat sink 82 is formed, thereby increasing the capacity of heat dissipation for the assembly 80. Wings 86 extend from the thermal leg 84 to increase the surface area of contact between the heat sink 82 and the thermal pad 42. In addition, the wings 86 extend generally upward from the thermal pad 42 thereby increasing the heat sink's 82 capacity to dissipate heat. An aperture feature 44 is formed in the portion of the thermal leg 84 adjacent and parallel to the thermal lead 58 to support or hold a thermal preform of thermal binder for use in thermally coupling the thermal leg 84 to the thermal lead 58. When the heat sink assembly 80 is heated during the standard surface mount manufacturing assembly process, the thermal preform is heated and the thermal binder begins to flow. By placing the aperture feature 44 and thermal preform adjacent to the contacting surface 85 of the thermal leg 84 of the heat sink 82, gravity will cause the thermal binder to flow out from the aperture along the contacting surface 85 of the thermal leg 84 of the heat sink 82 and between the thermal leg 84 and the heat dissipating surface 59 of the thermal lead 58 of the device package 34. As long as the contacting surface 85 of the thermal leg 84 and the dissipating surface 59 of the thermal lead 58 are not spaced too far apart, a combination of gravity, surface tension, friction, and other natural phenomena will cause the thermal binder to wick between the contacting surface 85 of the heat sink 82 and the dissipating surface 59 of the heat generating device package 34. After the heating process is complete, the thermal binder will cool and reform or recast forming an efficient thermal interface between the heat sink 82 and device package 34.

Unlike the embodiments of the inventive heat sink shown and described previously, the embodiment of the inventive heat sink 82 shown in FIG. 5 is not supported by, or is not piggyback upon, the heat generating device package 34. Instead, the heat sink 82 essentially rests on the thermal pad 42 of the substrate 14. More particularly, the heat sink 82 is supported by its thermal leg 84 and wings 86 which are in turn resting on the thermal pad 42. But for any direct contact between the thermal leg 84 of the heat sink and the thermal lead 58 of the device package 34, the heat sink 84 has no direct physical contact with the device package 34. Without any physical contact between the heat sink 84 and device package 34, the heat sink 84 and device package 34 could be placed on the board or substrate 14 during the same operation during the manufacturing process; that is, the heat sink 84 could be placed on the substrate 14 after the device package 34 is placed on the substrate 14 but before the device package 34 is secured to the substrate 14 using the standard heating process to reflow the masked solder paste. This means the heat sink 84 and device package 34 could both be secured to the substrate in one unified heating process, instead of several subsequent placing and heating operations.

Thus, to allow for this simplified manufacturing process, the thermal leg 84 and thermal lead 58 should not be in direct physical contact. However, in order to maximize the direct thermal path from the heat generating device package 34 to the heat sink 82, the heat sink 82 should be thermally coupled to both the thermal pad 42 and the thermal lead 58 of the device package 34. Both objectives can be accomplished by forming the heat sink 82 such that when the heat sink 82 is placed on the thermal pad 42 on the substrate 14, the portion of the thermal leg 84 of the heat sink 82 parallel to the thermal lead 58 of the device package 34 should be closely adjacent to the thermal lead 58 but not in direct physical contact, thereby allowing the heat sink 82 to be placed on the surface mount PCB 14 before the device package 34 is heated and secured to the PCB, without any danger of dislodging or dislocating the device package 34. Then, both the heat sink 82 and the device package 34 can be heated and secured to the PCB or substrate 14 in a unified heating process. During this same process, the thermal preform and wicking phenomena can be used to create a direct thermal path between the heat sink 82 and heat generating electronic device package 34.

Figure 6A:
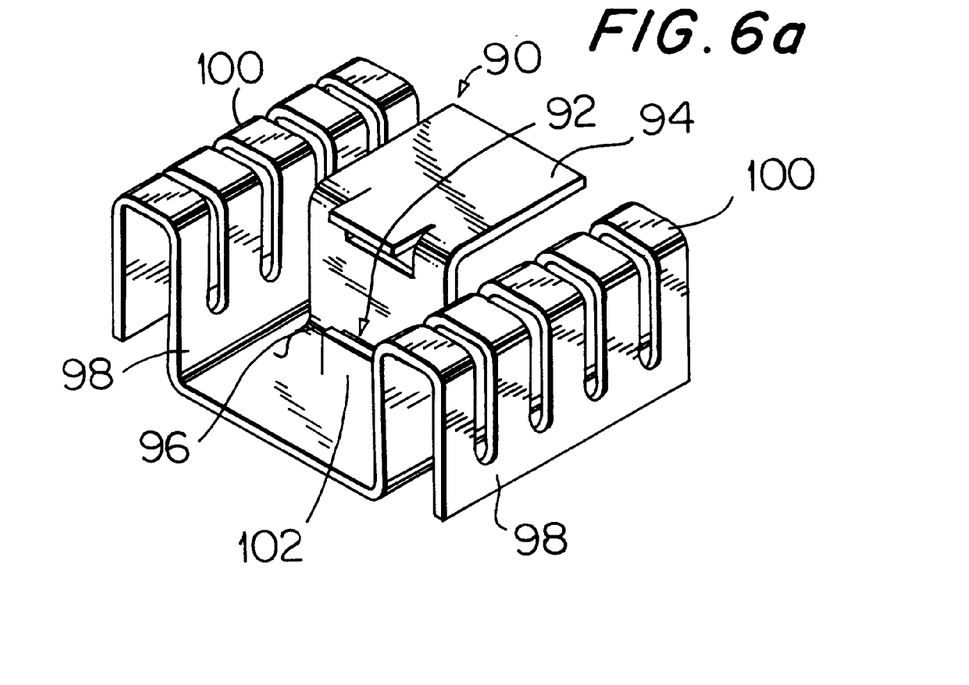
FIG. 6 is a perspective view and a side sectional view of an alternate embodiment of the heat sink of the present invention, where the body of the heat sink is formed to support a thermal preform.
Figure 6B:
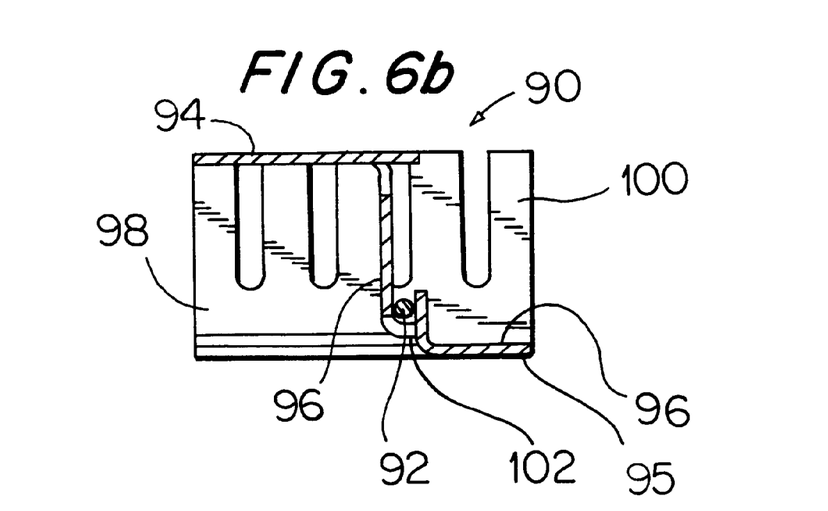

FIG. 6 shows a perspective view and a side sectional view of an alternate embodiment of the heat sink 90 of the present invention, where the heat sink 90 is formed to support a thermal preform 92. The embodiment of the heat sink 90 is similar to the embodiment of the heat sink 82 shown in FIG. 5 in that both heat sinks are designed to be supported by the substrate as opposed to the heat generating device package while still thermally coupling to a heat generating device package via a tab-type thermal lead. The heat sink 90 comprises a body 94 and a thermal leg 96 extending from the body 94. The body 94 of the heat sink 90 is generally planar and would be supported above the device package. As in the embodiment shown in FIG. 5, the thermal leg 96 of the heat sink 90 extends generally downward from the body 94 of the heat sink 90 to thermally couple with a thermal lead of an electronic device package and to a thermal pad on the surface of the substrate 14. The thermal leg 96 is formed arcuate or angled such that a portion thereof will be adjacent and parallel with a substantial portion of a thermal lead of an electronic device package. The thermal leg 96 is formed angled or arcuate such that another portion of the thermal leg 96 is adjacent and parallel with a substantial portion of a thermal pad on a substrate. By forming the heat sink 90 to contact a substantial portion of the thermal lead and the thermal pad, a larger thermal path to transfer heat to the heat sink 90 is formed, thereby increasing the capacity of heat dissipation for the assembly 80. Wings 98 extend from the thermal leg 96 to increase the surface area of contact between the heat sink 90 and the thermal pad. In addition, the wings 98 also extend upward from the thermal pad thereby increasing the heat sink's 90 capacity to dissipate heat. Fins 100 are formed in the wings 98 to further increase the surface area of the heat sink 90 and to increase air flow along and between the wings 98 to enhance heat dissipation to the surrounding air.

Instead of an aperture, a slot feature with a retaining ledge 102 is formed in the portion of the thermal leg 96 adjacent and parallel to the thermal lead to support or hold a thermal preform 92 of thermal binder for use in thermally coupling the thermal leg 96 to the thermal lead of a heat generating device package. When the heat sink assembly 80 is heated during the standard surface mount manufacturing assembly process, the thermal preform 92 is heated and the thermal binder begins to flow. Again, by placing the slot feature 102 and thermal preform 92 adjacent to the contacting surface 95 of the thermal leg 96 of the heat sink 90, gravity will cause the thermal binder to flow out from the slot feature 102 along the contacting surface 95 of the thermal leg 96 of the heat sink 90 and between the thermal leg 96 and the thermal lead of the device package. As long as the surfaces of the thermal leg 96 and thermal lead of the device package are not spaced too far apart, a combination of gravity, surface tension, friction, and other natural phenomena will cause the thermal binder to wick between the contacting surface 95 of the heat sink 90 and the dissipating surface of the heat generating device package. After the heating process is complete, the thermal binder will cool and reform or recast forming an efficient thermal interface between the heat sink 90 and device package 34.

Since this embodiment of the inventive heat sink 90 is also not supported by, or is not piggyback upon, the heat generating device package, it can also be designed to have no direct physical contact with the device package thereby allowing the heat sink 90 and device package to be placed on the substrate during the same operation during the manufacturing process. This means the heat sink 90 and device package can again both be placed and secured to the substrate in one unified process, instead of several subsequent placing and heating operations.

Figure 7A:
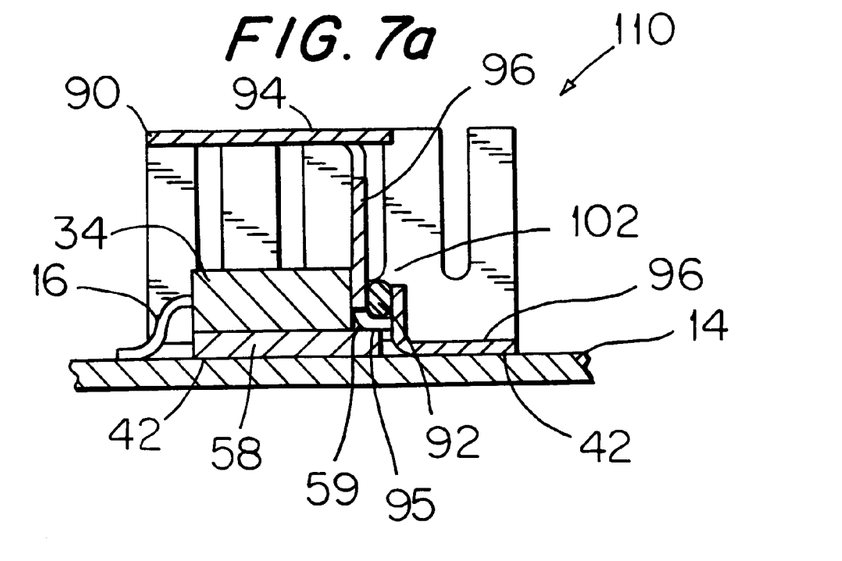
FIG. 7 is a side sectional view of a heat dissipating assembly incorporating the alternate embodiment of the heat sink of the present invention shown in FIG. 6, where the thermal preform supported by the body of the heat sink is shown before and after the heating operation of the typical surface mount manufacturing process.
Figure 7B:
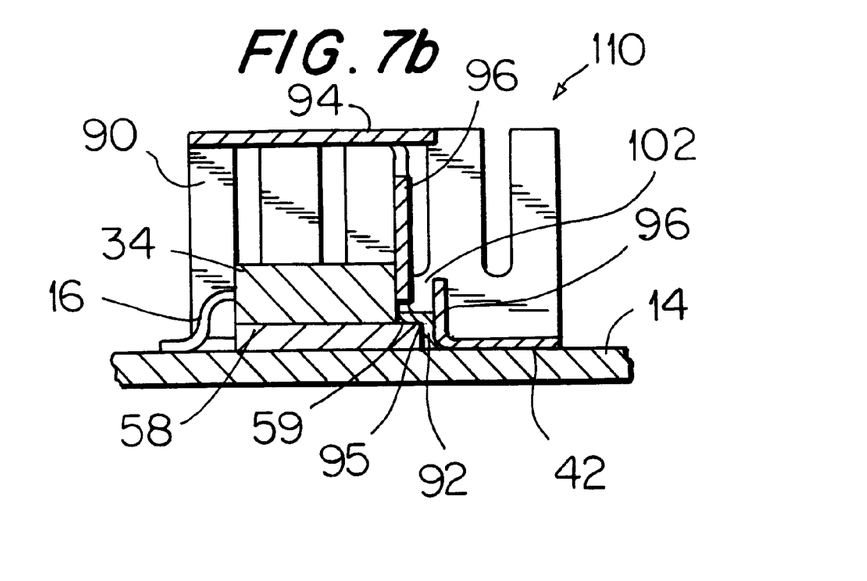

FIG. 7 is a multiple side sectional view of a heat dissipating assembly 110 incorporating an alternate embodiment of the heat sink 90 of the present invention, where the thermal preform 92 supported by the thermal leg 96 of the heat sink 90 is shown before and after the heating operation of the typical surface mount manufacturing process. The heat dissipating assembly comprises a heat sink 90 and a heat generating device package 34 supported on a thermal pad 42 on the substrate 14. The device package 34 is thermally coupled to the thermal pad 42 via its collector tab which forms a tab-type thermal lead 58. Electrical leads 16 are not being used as thermal leads. The body 94 of the heat sink 90 is generally planar and is supported above the device package 34. Extending generally downward from the body 94 of the heat sink 90 is thermal leg 96. Thermal leg 96 is formed arcuate or angled such that a portion of the thermal leg 96 is adjacent and parallel to the thermal lead 58 of the device package 34, a further portion of the thermal leg 96 is adjacent and parallel with the thermal pad 42 on the substrate 14. As long as the portion of the thermal leg 96 adjacent and parallel to the thermal lead 58 is not in direct physical contact with the thermal lead 58 of the device package 34, both the heat sink 90 and the device package 34 can be placed on the board before the heating operation in the typical surface mount manufacturing assembly process.

In the portion of the thermal leg 96 which is adjacent and parallel to the thermal lead, a slot with a retaining wall or ledge 102 has been formed to support the thermal preform 92. Once both the device package 34 and then the heat sink 90 have been placed on the substrate 14, the heating process to secure both bodies to the substrate can be initiated. During this same heating operation, the thermal preform 92 will become heated and the thermal binder will flow through the slot feature 102, as directed by the retaining wall, along the thermal leg 96 and between the contacting surface 95 of the thermal leg 96 of the heat sink 90 and the dissipating surface 59 thermal lead 58 of the device package 34. Again, the wicking process will result in an efficient thermal interface between the heat sink 90 and the device package 34 even though the surfaces of both were separated by some distance initially, i.e., were not in physical contact.

While the invention has been particularly shown and described with respect to specific embodiments thereof, it is to be understood that various changes in form and detail may be made hereto without departing from the spirit and scope of the present invention and shall be encompassed within the scope of the appended claims.

What is claimed is:

1. A method of thermally connecting a heat sink to a surface mount heat generating electronic device, comprising the steps of:

providing a surface mount heat generating device having a device contact region;

providing a heat sink having a heat sink contact region with an aperture formed therein, said aperture containing a reservoir of solidified thermal binder;

disposing said heat sink in proximity to said heat generating device;

melting said thermal binder for causing it to flow out of said aperture for forming a thermal and mechanical coupling between said heat sink and said device upon re-solidification of said thermal binder.

2. The method as described in claim 1, wherein said reservoir of thermal binder is supported by a feature on said heat sink.

3. The method of claim 1, wherein said step of disposing comprises the step of disposing said heat sink in contact with said heat generating device.

4. The method of claim 1, wherein said step of providing a heat generating device comprises providing a heat generating device mounted to a substrate.

5. The method of claim 4, wherein said step of disposing comprises the step of disposing said heat sink in contact with said substrate.

6. The method of claim 4, wherein said step of disposing comprises the step of disposing said heat sink in contact with said substrate and said heat generating device.

7. A method of forming a reservoir of thermal binder in a heat sink contact region for facilitating thermal and mechanical coupling of said heat sink to a heat conducting device, comprising the steps of:

providing a heat sink;

forming an aperture in the heat sink contact region, said aperture having an exit end; and disposing said thermal binder in the aperture, whereby when said heat sink is disposed in proximity to said heat conducting device and said thermal binder is melted, said thermal binder flows out of said exit end for forming a thermal and mechanical coupling between said heat sink and said heat conducting device.

8. The method of claim 7, wherein said disposing step comprises the steps of temporarily obstructing the exit end of the aperture, melting the thermal binder in the aperture, and re-solidifying said thermal binder in the aperture thereby sealing said exit end with said thermal binder.

9. The method of claim 8, wherein said disposing step comprises disposing melted thermal binder in the aperture and re-solidifying the melted thermal binder in the aperture.

10. The method of claim 7, wherein said aperture is formed in a feature on said heat sink.

* * * * *